US005844460A

United States Patent [19]

Bogdan et al.

[11] Patent Number: 5,844,460

[45] Date of Patent: Dec. 1, 1998

[54] WOUND, SOLID STATE INDUCTOR

[75] Inventors: Alexei Bogdan, Bolton; Emil S. Sagalovich, Thornhill, both of Canada

[73] Assignee: Dyalem Concepts Inc., Kanata, Canada

[21] Appl. No.: 871,839

[22] Filed: Jun. 9, 1997

[51] Int. Cl.[6] .............................. H01F 29/00; H01F 17/00; H03H 7/18

[52] U.S. Cl. .............................. 336/177; 336/70; 336/223; 336/69; 333/140; 333/181

[58] Field of Search .............................. 336/69, 70, 177, 336/223; 33/140, 161, 181, 185, 238, 246

[56] References Cited

U.S. PATENT DOCUMENTS

| | | | |
|---|---|---|---|
| 3,247,476 | 4/1966 | Pintell | 336/206 |
| 4,755,783 | 7/1988 | Fleischer et al. | 336/84 |
| 4,943,793 | 7/1990 | Ngo et al. | 336/83 |
| 5,285,570 | 2/1994 | Fulinara | 29/830 |

*Primary Examiner*—Renee S. Luebke
*Assistant Examiner*—Anh Mai
*Attorney, Agent, or Firm*—Donald E. Hewson

[57] ABSTRACT

Wound, solid state inductors are provided by winding flexible plastic tape having electrically insulative and magnetic permeability properties. Such tape is sometimes referred to as magnetic tape. An electrically conductive layer is placed on at least one surface of the magnetic tape, or both, and electrical connections are provided to the ends of the electrically conductive layer or layers. When the magnetic tape is wound into a coil, spirally or helically, and an alternating current is applied to the electrical connection, an inductive reactance will be noted. If there are two electrically conductive layers, and a voltage is applied between them, a capacitive reactance will be noted. In that case, a complex capacitive inductor element or inductive capacitor element has been configured. The wound inductors are small, light weight, inexpensive, and relatively shock proof, when compared with prior wound inductors having separate magnetic cones and wire windings placed over them. In an alternative embodiment, a single strip, or a pair of strips, of electrically conductive material may be formed by placing a plurality of diagonally oriented strips of conductive material on both sides of the flexible plastic tape, and connecting the portions where they overlie each other at each edge of the tape so as to provide an electrically conductive strip or strips having a length or lengths longer than the length of the tape.

20 Claims, 3 Drawing Sheets

WOUND, SOLID STATE INDUCTOR

FIELD OF THE INVENTION

This invention relates to inductors, particularly inductors that are wound, solid state inductors which do not have a separate ferromagnetic core. The present invention provides low-cost, high-accuracy inductors which may be provided having selected inductances over a wide range of inductance values; and, in a further configuration of the present invention, electrically reactive elements which may be considered as inductive capacitors or capacitive inductors are provided. The various reactive elements in keeping with the present invention are, in any event, based on a coreless, wound inductor embodiment. Still further, the wound inductor elements of the present invention may be available in physically small and relatively flat configurations, thereby making them more desirable for use in electrical and electronic circuitry which is particularly intended to have small physical size and which are generally constructed using printed circuit boards and the like.

BACKGROUND OF THE INVENTION

In the design, construction, and presentation of many electrical and electronic circuits of all sorts, there may be reliance upon the use of inductive elements for a variety of electrical circuit reactance purposes. Generally, in many alternating current circuits over a wide range of frequencies, but usually below one MHz, the use of inductors is required to counteract apparent negative resistance as such might appear in electrical terms to a source of alternating current electrical energy. For example, power factor correction circuitry for use in association with various kinds of motor control or lighting control circuits will require the use of inductive elements. Other typical circuits may include power electronics such as power supplies for a variety of electrically operating devices, or any such circuit which requires the use of a filter tank circuit to reduce variation of power factor values, and to diminish any electric noise generated or transmitted back to a power source.

Currently, inductors may be required that have inductance or reactive values in the range of 300 $\mu$H up to 300 mH. However, currently available inductors have a number of characteristics which have been, heretofore, difficult to avoid because the use of inductors has been required. Such characteristics include the fact that they are bulky, hard to mount, expensive, and have poor tolerance—that is, the specific inductance reactance of any particular inductor might range as much as 10% to 20% of its rated value. For inductors that may have tolerance in the range of 1% of rated value, the prices may be multiples of the per unit price of the poorer tolerance inductors.

In general, prior art inductors require a core around which a number of windings or coils of wire such as copper wire are placed. Even with automated equipment, the production of inductors is expensive; and if inductors that have very little tolerance with respect to their rated value are required, they might be required to have been manually constructed or at least manually adjusted.

Generally, a core has been required to be present in inductors, especially those relying on the permeability of the core as compared with the permeability of air to make the inductor much smaller. However, the cores must first be manufactured, and then the inductor wound on the cores; and thus, the inductor is both bulky and expensive. Usual cores have been ferromagnetic or permalloy, and they are thus relatively heavy due to the density of the core material. Still further, depending on the core material being used, there may be excessive eddy currents that are developed, and the hysteresis or gauss curves may be very non-linear. Even further, different materials for the core may be required depending on the intended operating frequency at which the inductor will be used. This may increase the necessity for higher inventory amounts of inductors, even though they may have the same inductive ratings; and, once again, the requirement for differing core materials adds to the cost of production and acquisition of inductors.

For a variety of reasons, inductors that are presently available may be presented in a variety of configurations. For example, the cores may be torrodial, they may have E-shaped core or H-shaped core configurations, or the cores may be wound on a post or bobbin, so that in all events the inductors are quite bulky. Without the addition of a mounting frame, or unless the inductors are cast or potted into a lacquer or other potting material, presently available inductors are difficult to mount, and they may be somewhat fragile in that they may be incapable of withstanding severe shocks.

If an inductor having a specific reactive value, within quite tight tolerance levels is required, that inductor must have a specific and controlled gap—which would be determined according to the manner in which it is constructed—and creating a specific and controlled gap may be quite labor intensive and thus expensive.

The inventors herein have quite unexpectedly discovered that, if a magnetic tape, which is one having known permeability characteristics, is coated with a conductive coating and is wound, a small, light-weight, inexpensive inductor having a close tolerance as to its inductive value, can be produced. Still further, as noted hereafter, by providing an additional conductive surface so that one conductive surface is formed on each side of a tape having magnetic permeability characteristics, a capacitance by way of a wound capacitor may also be formed in that the magnetic tape will serve the function of a separator between the capacitor plates, which are formed by the electrically conductive layers on each side of the tape.

More particularly, the present inventors have determined that inductors can be provided by the use of plastic tapes which have magnetic properties, and therefore magnetic permeability properties, where at least one conductive layer is formed on one surface of the tape and the tape is wound into a roll. Because the permeability of the electrically insulative tape can be determined or selected, a very specific inductance value can be obtained simply by winding a tape having a particular length. Moreover, very specific inductance values can be obtained by constantly measuring the inductance of the wound inductor as it is being wound and terminating the winding procedure when the selected inductance value has been reached.

Moreover, a zig-zag configuration of diagonally oriented strips of conductive coating can be placed on both sides of the tape, and their overlapping ends at each side of the tape connected, so as to provide a conductive strip which is longer than the length of the tape. Also, interposed along conductive strips can be provided, having capacitance between them.

A particular advantage of wound inductors in keeping with the present invention is that they are quite small in size, they may require only a few turns in order to arrive at the selected inductance value, and they will have very low heat dissipation.

The selection of various tapes having differing permeability properties can lead to close tolerances of inductive value with relatively low expense in terms of production of wound inductors in keeping with the present invention. However, inductors in keeping with the present invention may be used over a wide range of operating frequencies.

Typically, inductors in keeping with the present invention will be found most useful at operating frequencies below 1 MHz. A particular use has been found for inductors in keeping with the present invention which are employed in switch mode power supplies that might operate over ranges of 20 KHz to 50 KHz. Such switch mode power supplies might, for example, be found in electronic ballasts for fluorescent lighting installations, and the like. As noted, wound, solid state inductors in keeping with the present invention can also be configured so as to provide capacitance as well as inductance, in a single physical element. Moreover, as noted, that element may be quite small in physical size when compared with ordinary coil type inductors and capacitors that are presently available, and may be easily mounted on a printed circuit board. Indeed, with appropriate configuration, wound inductors in keeping with the present invention may be constituted as isolation transformers.

SUMMARY OF THE INVENTION

In accordance with one aspect of the present invention, there is provided inexpensive inductors having specific inductance values within a very close tolerance range, and which do not include a preformed core.

A further purpose of the present invention is to provide wound, solid state inductors which may be easily mounted to such as a printed circuit board, and which will withstand shock without losing their inductive value.

Yet a further purpose of the present invention is to provide solid state circuit elements which combine inductance and capacitance values in the same element, and which might thus be viewed as being inductive capacitors or capacitive inductors.

The present invention provides a wound, solid state inductor comprising a plurality of wound layers of a flexible plastic tape which has electrically insulative and magnetic permeability properties. The tape has two surfaces, a finite length, and a selected thickness; and the tape has a layer of electrically conductive material on at least one of its surfaces. The at least one layer of electrically conductive material has a finite length which is substantially the same as the finite length of the tape. Thus, a flexible plastic tape having electrically insulative and magnetic permeability properties, and having a layer of electrically conductive material on at least one of its surfaces, can be pre-manufactured, and the wound, solid state inductor may easily be formed by winding a finite length of that tape, where the finite length has been selected, or where the winding continues until the specified inductive value is reached. The present invention particularly contemplates that numerous quantities of inductors, each having very close tolerances as to its design criteria, can be easily and inexpensively manufactured.

Electrical connections are made to the at least one electrically conductive material at each end thereof, so that an inductance will be created by the wound layers of the flexible tape due to the magnetic permeability properties thereof when an alternating current signal is imposed on the conductive material layer between the electrical connections at the ends thereof. Thus, the reactive value of the inductance will appear between the electrical connections at the ends of the wound conductive material layer in the wound, solid state inductor.

In a particular embodiment of the wound, solid state inductor of the present invention, there are two layers of electrically conductive material placed on the tape, one at each side thereof. Electrical capacitance can therefore be created between the two layers of electrically conductive material when a voltage is imposed between the conductive layers.

Yet another embodiment of the present invention provides a wound, solid state inductor comprising a plurality of wound layers of a flexible plastic tape which has electrically insulative and magnetic permeability properties. Once again, the tape has two surfaces, a finite length, a selected thickness, and a selected width defined by its two edges; and the tape has a plurality of diagonally oriented strips of electrically conductive material which are placed on each of the two surfaces. Here, each end portion of each diagonally oriented strip, at each edge of the tape overlies an end portion of a diagonally oriented strip which is located on the other surface of the tape. Moreover, the diagonal orientation of the strips on one of the two surfaces of the tape is in a zig-zag fashion with respect to the diagonal orientation of the strips on the other of the two surfaces. Connection means are provided to connect each pair of overlying end portions, so as to thereby form a single continuous strip of electrically conductive material which has a finite length greater than the finite length of the flexible plastic tape.

When electrical connections are made to each end of the continuous strip of electrically conductive material, and the flexible plastic tape is wound, an inductance is created due to the magnetic permeability properties of the tape when an alternating current signal is imposed on the strip of conductive material between the electrical connections.

Still further, two continuous and contiguous strips of conductive material may be formed by interposing a further plurality of diagonally oriented strips on each of the two surfaces of the plastic tape, and connecting their respective overlying end portions. In this manner, a capacitance can also be created between the two contiguous strips of conductive material, when a voltage is imposed between them.

BRIEF DESCRIPTION OF THE DRAWINGS

The novel features which are believed to be characteristic of the present invention, as to its structure, organization, use and method of operation, together with further objectives and advantages thereof, will be better understood from the following drawings. It is expressly understood, however, that the drawings are for the purpose of illustration and description only and are not intended as a definition of the limits of the invention. Embodiments of this invention will now be described by way of example in association with the accompanying drawings in which.

DETAILED DESCRIPTION OF THE PREFERRED EMBODIMENTS

Reference will first be made to FIGS. 1 through 10.

In general, the present invention comprises a wound, solid state inductor which is made by winding a flexible plastic tape which has electrically insulative and magnetic permeability properties and which has at least one conductive layer on at least one surface thereof.

Figure 1:
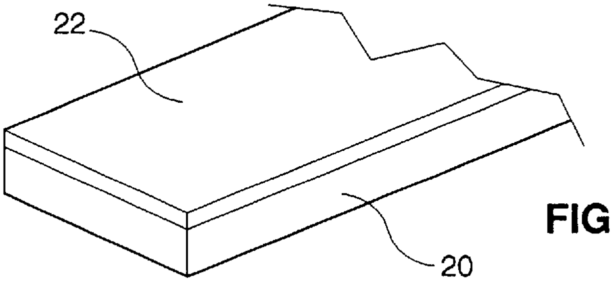
FIG. 1 is a perspective view of a typical tape used in keeping with the present invention.

Referring to FIG. 1, a flexible tape 20 is shown, having a layer 22 of electrically conductive material on the upper surface thereof. The tape 20 is plastic and is flexible, and it has electrically insulative properties and magnetic permeability properties. The layer 22 is likewise flexible, and is electrically conductive.

Figure 2:
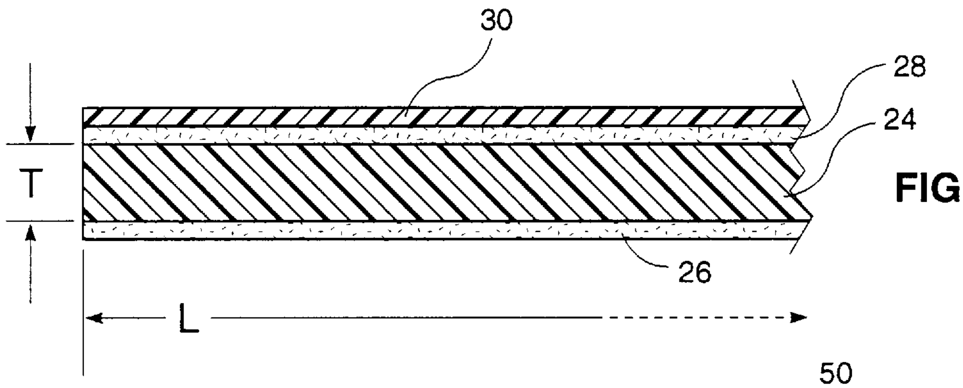
FIG. 2 is a side sectional view of another typical tape used in keeping with the present invention.

A different tape is shown in FIG. 2, in that the tape 24, which also has electrically insulative and magnetic permeability properties, has electrically conductive material layers 26 and 28 on both sides thereof. An insulating layer 30 is also shown in FIG. 2.

The magnetic permeability properties of the flexible tape 20 or 24, for example, come as a consequence of the embedment of a fine powdered or particulate material having magnetic or ferromagnetic properties into a plastic base material. Accordingly, the material of the tape 20 or 24 may be referred to as a magnetic tape.

Typically, the fine powdered or particulate material having magnetic or ferromagnetic properties may be ferrous oxide or ferric oxide, or it may be specific alloys of iron, nickel, zinc, magnesium, manganese, cobalt, and combinations thereof, chosen for particular permeability values. Clearly, any specific choice of any material having magnetic or ferromagnetic properties will be predicated upon the permeability properties of the tape which are to be required for the production of any particular wound, solid state inductor in keeping with the present invention. The plastic base material for the plastic tape might typically be chosen from the group consisting of mylar, vinyl, polyethylene, polyethylene teraphthalate (PET), polyvinylchloride (PVC), polytetrafluoroethylene (PTFE), and combinations and mixtures thereof. The layer of electrically conductive material in any of the illustrative figures discussed herein is typically chosen from the group of metals consisting of aluminium, gold, silver, copper, and mixtures and alloys thereof. The layer of electrically conductive material is placed on the plastic tape having electrically insulative and magnetic permeability properties typically by vacuum depositing or metallizing; but it may be deposited by such process as sputtering, electroless plating, precipitate depositing, or by coating using a brush, a roller, or a depositor and a doctor blade. The layer or layers of electrically conductive material may be fused to the plastic tape, such as by passing the tape through a pair of heated rollers.

Figure 3:
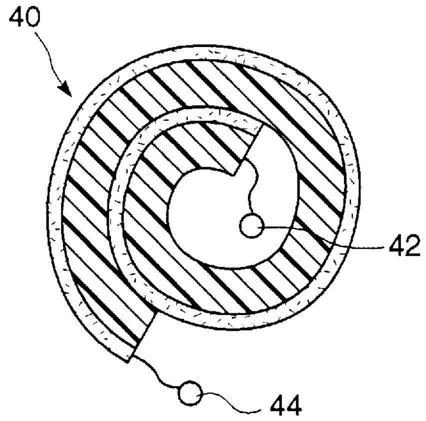
FIG. 3 illustrates a typical conformation of an inductor in keeping with the present invention.
Figure 4:
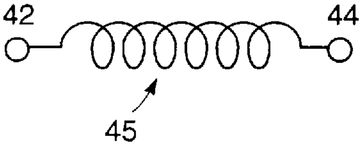
FIG. 4 shows the electrical element of FIG. 3.

Referring to FIG. 3, a typical tape such as tape 20 of FIG. 1 having a single conductive layer on one side thereof is rolled into a spiral 40. Electrical connections 42 and 44 are made, and may be brought to terminations, such as those shown at 42 and 44. When an alternating current signal is imposed on the conductive material layer between the electrical connections 42 and 44, an inductance is created in the element 40 by the wound layers of flexible plastic tape, due to the magnetic permeability properties thereof. The reactive value of the inductance appears between the electrical connections 42 and 44, and is shown in FIG. 4 as inductor 45.

Figure 5:
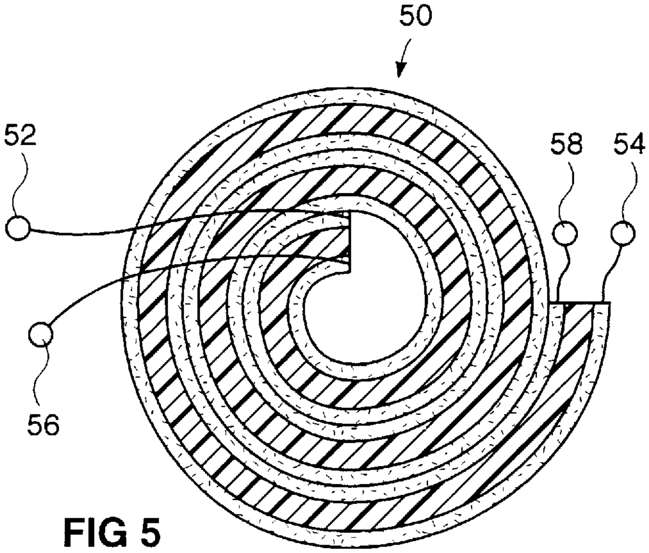
FIG. 5 is the confirmation of another typical inductor in keeping with the present invention.

If a tape such as tape 24 is used to form an element such as 50 in FIG. 5, then it is seen that the conductive layers 26 and 28 will form a pair of coils on either side of the tape. Typically, an insulative layer 30 is placed on one of the conductive layers (28, as shown in FIG. 2) so that the conductive layers do not electrically short circuit one to the other. Here, terminations 52 and 54 are provided to the ends of one of the conductive layers, and terminations 56 and 58 are provided to the ends of the other conductive layer. It will be seen that, once again because of the presence of the flexible plastic tape having electrically insulative and magnetic permeability properties, a pair of inductances may be created when alternating current signals are imposed at terminals 52 and 54 or terminals 56 and 58. Inductive reactances 55 and 57 will thus appear between terminals 52, 54, and 56, 58, respectively. Moreover, when a voltage is imposed between the conductive layers, there will be capacitive reactance such as that shown at 53 and 59 in FIG. 6.

Figure 7:
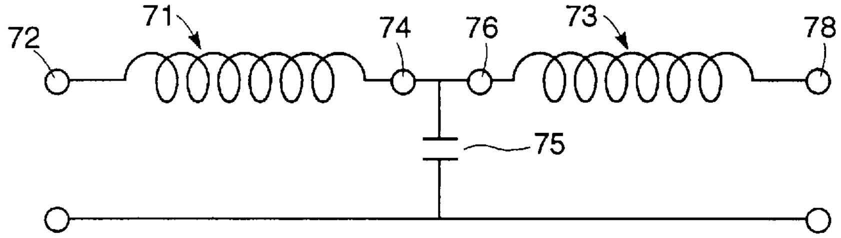
FIG. 7 shows another typical reactive circuit formed by the inductor of the present invention.

Another configuration which may be possible from a configuration such as that shown in FIG. 5 is the circuit element of FIG. 7, having inductances 71 and 73, and capacitance 75, and terminals 72, 74, 76, and 78 appropriately connected. Thus, configurations such as that shown in FIG. 5 may variously be considered inductive capacitances or capacitive inductances, since the reactive inductance and reactive capacitance values can be designed and determined for specific operating circumstances including designed frequency ranges, voltage levels, power ratings, and the like. Typically, capacitances in the range of 500 $\mu$H or 300 mH, at 1 KVA, are realized. Moreover, a typical embodiment might have electrical characteristics with very low active resistance, in the range of 0.2 omhs, with an inductance of 750 $\mu$H and a capacitance of 0.5 pF. Such an element may have only a few turns, or it might have 60 or 70 turns of the wound flexible plastic tape. There is low heat dissipation from such elements.

Figure 10:
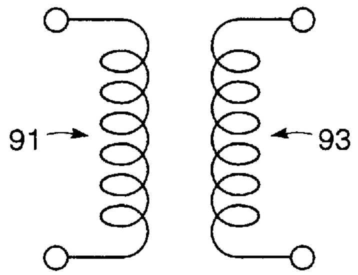
FIG. 10 is another typical circuit element which can be formed by the present invention.

In yet another prospective embodiment, as shown in FIG. 10, an isolation transformer having primary and secondary windings 91 and 93 may be configured. To do so, typically a tape such as that shown in FIG. 2 will be used except that instead of the electrically insulating layer 30, a second layer having electrically insulative and magnetic permeability properties will be used.

Figure 8:
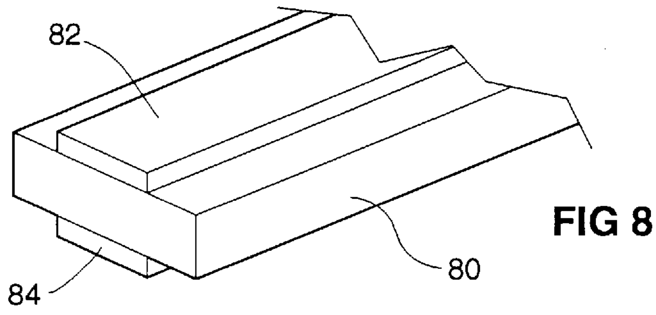
FIG. 8 shows another tape having conductive layers on both sides thereof placed in a particular manner.

If a tape having a configuration such as that such shown in FIG. 8 is used, there will typically be a further insulation coating on one or the other of the electrically conductive layers 82 and 84, placed on the magnetic permeability tape 80. Winding a wound inductor with a tape 80, particularly if the winding is to be performed helically along a mandrel, is easily effected. The mandrel may then be removed, so that the wound inductor is otherwise monolithic insofar as its structure comprising the plastic tape layer having electrically insulative and magnetic permeability properties, and the electrically conductive layers, is concerned. Moreover, the lapping portions of the permeability layer 80 may be bonded together.

Figure 9:
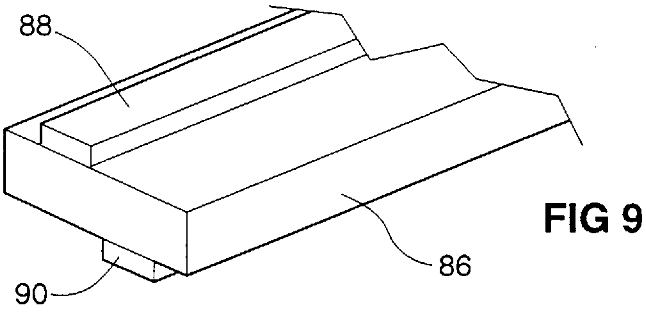
FIG. 9 shows another conductive tape similar to FIG. 8 but with different placement of conductive layers on the tape.

If a tape such as that shown in FIG. 9 is used, comprising the magnetic permeability plastic tape 86 and electrically conductive layers 88 and 89, it may be wound in a manner such as shown in FIG. 5 where the conductive layers 88 and 90 do not contact one another. A more tightly wound inductor element may thereby be produced.

Referring again to FIG. 2, the thickness "T" and length "L" of the flexible plastic tape may clearly be chosen so that the reactive value of the inductance which is created as the element is wound can be chosen and will have a selected value. Likewise, where there are two layers of electrically conductive material, the thickness of the flexible plastic tape will also effect the capacitance, if such is desired and a specific capacitance value is required.

Referring now to FIGS. 11 through 14, several alternative embodiments of wound, solid state inductors in keeping with the present invention are shown. In each of these embodiments, a flexible tape 110 is shown, which otherwise has electrically insulative and magnetic permeability properties in the same sense and manner as the flexible tapes 20, 24, which are discussed above. Thus, the same discussion with respect to tapes 20, 24, above, is applicable to flexible tape 110.

Figure 11:
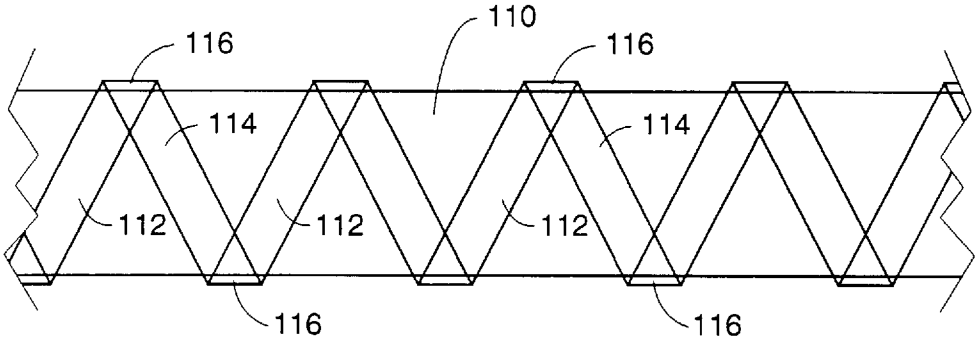
FIG. 11 is a schematic representation of another embodiment according to the present invention, showing diagonally oriented strips of electrically conductive material on both surfaces of a tape.

Referring to FIG. 11, there are a plurality of diagonally oriented strips 112 of electrically conductive material which are placed on one surface of the flexible surface of the tape 110. There are also a plurality of diagonally oriented strips 114 on the other surface of the flexible plastic tape 110. Each diagonally oriented strip 112, 114 has an end portion located at each edge of the tape 110. However, as noted, the diagonally oriented strips 112 and 114 are located on their respective surfaces of the tape 110 in such a manner that their diagonal orientation with respect to each other is in a zig-zag fashion. Moreover, the end portions at each edge of the tape 110 of each of the strips 112, 114 overlie one another. If the respective overlying end portions of the diagonally oriented strips 112, 114 are connected together, so that there is electrical continuity between them, it is evident that the connected diagonally oriented strips on the two surfaces of the flexible plastic tape 110 will form a single continuous strips of electrically conductive material, which has a finite length greater than the finite length of the flexible plastic tape. Obviously, that single continuous strip has an end at each end of the tape.

Figure 13:
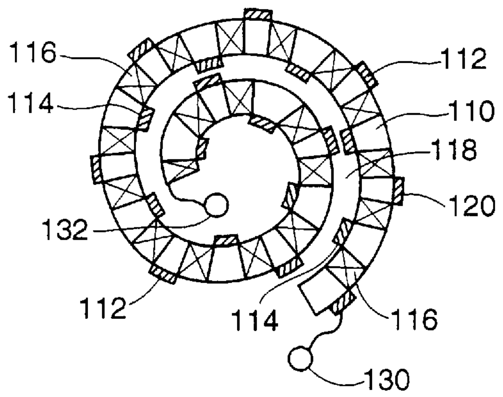
FIG. 13 is similar to FIG. 3, but using the tape of either FIG. 11 or FIG. 12.

If the flexible plastic tape 110 is rolled into a spiral, as shown in FIG. 13, then it is evident that at least portions of each of the individual diagonally oriented strips 112, 114 will face portions of individual ones of the plurality of diagonally oriented strips 114, 112 which are placed on the other surface of the tape 110. Accordingly, a layer of electrically insulating material 118 is placed over one of the surfaces of the tape 110, so as to provide electrical insulation between the facing portions of individual ones of the diagonally oriented strips 112, 114.

If electrical connections such as connections 130, 132, shown in FIG. 13, are provided at each end of the single continuous strip, after the flexible plastic tape has been wound, there will be an inductance created as a consequence of the magnetic permeability properties of the flexible plastic tape when an alternating current signal is imposed on the single continuous strip of conductive material between the electrical connections 130, 132. Thus, while the principals of creation of a wound, solid state inductor are the same with respect to the embodiment of FIG. 11 (or FIGS. 12 and 14, as discussed hereafter) as they are with respect to any of the embodiments of FIGS. 1, 2, 8, and 9, the reactance value may be different, because of the length of the single continuous strip comprised by the individual strips 112 and 114.

Returning to FIG. 11, one manner by which the connection means between the overlying end portions of conductive strips 112, 114, is shown. Here, a small quantity of electrically conductive material 116 is placed at each of the two edges of the flexible plastic tape 110, in each instance in the region where the end portions of the diagonally oriented strips 112, 114 overlie one another. These small quantities of further electrically conductive material may be, in essence, the same as edge connections such as those which may be placed at the edges of printed circuit boards except that the base is flexible plastic tape. The edge connections 116 may be placed in their respective positions by one of several different steps: For example, using appropriate masks and stepping control, conductive material can be sputtered into place, or plasma sprayed into place. Plating techniques can be used; or individual strips of conductive material can be soldered into place or crimped into place.

Figure 12:
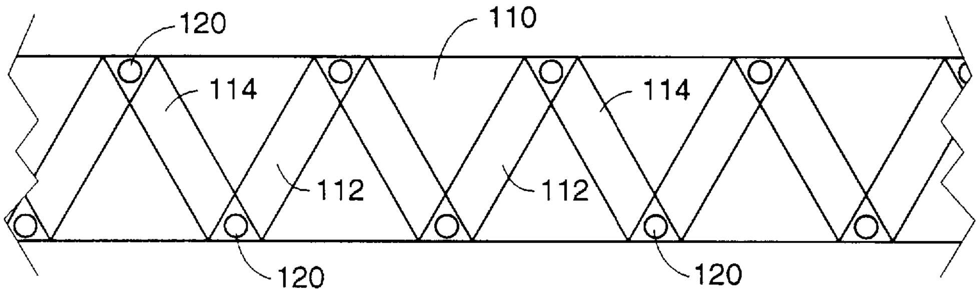
FIG. 12 is an alternative embodiment of FIG. 11, with different connection means between strips of conductive material on both sides of a tape.

In an alternative manner for placing connection means between overlying end portions of diagonally oriented electrically conductive strips, connectors such as those shown at 120 in FIG. 12 can be fixed in place. There, each of the connectors 120 comprises a conductive element which passes through the thickness of the flexible plastic tape 110 in each of the regions where the end portions of the diagonally oriented strips of electrically conductive material 112, 114 overlie one another. Each conductive element 120 is, of course, in electrically conductive contact with the respect end portions of the strips 112, 114.

The conductive elements 120 may be such as plated-through holes, using the well known printed circuit board techniques for the manufacture of plated-through holes. They may also be such as rivets, staples, grommets, studs, or pins, and the like, which are mechanically fixed in place.

Figure 14:
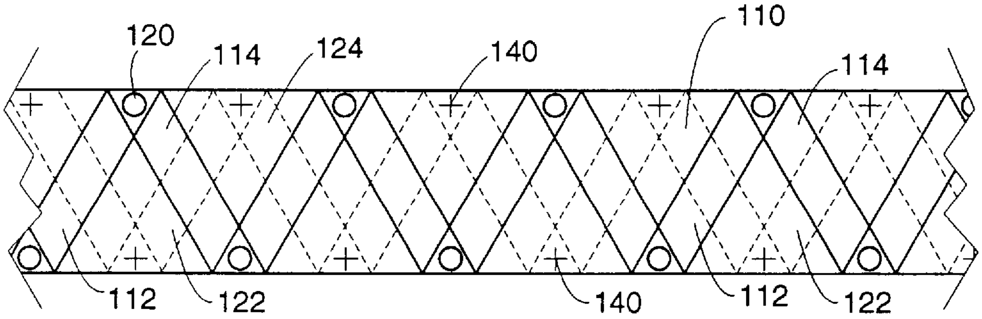
FIG. 14 is yet another alternative embodiment of either FIGS. 11 or 12, having interposed conductive strips on each side of the plastic tape.

Finally referring to FIG. 14, yet a further embodiment of wound, solid state inductors in keeping with the present invention is shown. Here, there are two continuous and contiguous strips of conductive material which are placed on the two surfaces of a flexible plastic tape 110. This is accommodated by interposing strips 122 between strips 112, and strips 124 between strips 114, and connecting their respective overlying end portions.

It can be seen, from FIG. 14, that two independent continuous strips of conductive material, each having a length which is longer than the finite length of the tape 110, are formed. The first is formed by the co-operation of strips 112, 114 as before; the second continuous strip is formed by the co-operation of strips 122, 124.

The connection means for each of the two continuous and contiguous strips that are thus formed, at the respective overlying ends, may be formed in much the same manner as described above. For convenience, connections 120 are shown between conductive strips 112, 114, the same as in FIG. 12; connections means 140 are shown schematically, between strips 122, 124.

Figure 6:
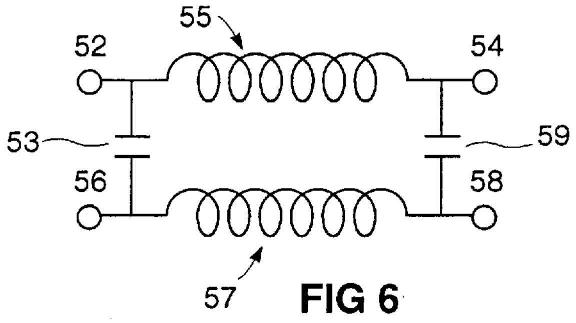
FIG. 6 shows a typical reactive circuit of the inductor of FIG. 5.

In the same manner as two layers of conductive material are shown in FIG. 5, with equivalent circuits such as those shown in FIGS. 6 and 7, similar connections can be made for a configuration having interposed electrically conductive strips, as shown in FIG. 14. Also, in the same manner, when a voltage is imposed between the strips 112, 114, and strips 122, 124, a capacitance will be created between them. Thus, the same discussions as made above with respect to the configurations of FIGS. 3 through 7, and 10, will apply in appropriate manners to the configurations of FIGS. 11 through 14.

As noted, the magnetic permeability properties of any of the magnetic tapes used in keeping with the present invention may be closely regulated using ordinary manufacturing processes for magnetic tape. Thus, a wound, solid state inductor can be manufactured having a chosen inductance, and capacitance if necessary, within very close tolerance values. However, if a very specific inductance is required, which may not be one which would normally be available otherwise in an off-the-shelf inductor, or which may otherwise be required within extremely close tolerances for other purposes, it is possible that an inductor in keeping with the present invention can be wound while continuously measuring the inductance being created. When a specific value is reached, the winding process is terminated and the tape is cut, and the very close tolerance wound inductor is thereby created.

Because there is no separate metallic core, both the size and weight of wound, solid state inductors in keeping with the present invention are reduced. Moreover, due to the flexibility of the magnetic tape which is used as the principal constituent element of the inductors according to the present invention, they are quite significantly shock proof. Still further, because of their size, inductors in keeping with the present invention may be easily mounted to printed circuit boards and the like; and because they have lower heat dissipation than conventional inductors of similar ratings, the wound, solid state inductors of the present invention may find particular utilization in high power (up to 1 KVA) power supplies or the like in small hand held appliances, lap-top computers, and the like.

Other modifications and alterations may be used in the design and manufacture of the apparatus of the present invention without departing from the spirit and scope of the accompanying claims.

What is claimed is:

1. A wound, solid state inductor comprising a plurality of wound layers of a flexible plastic tape having electrically insulative and magnetic permeability properties, where said tape has two surfaces, a finite length, and a selected thickness, and has a layer of electrically conductive material on at least one of said surfaces;

wherein said at least one layer of electrically conductive material has a finite length which is the same as the finite length of said tape;

wherein electrical connections are made to said at least one electrically conductive material layer at each end thereof; and wherein a fine powdered or pariculate material having magnetic or ferromagnetic properties is embedded into a plastic base material for said flexible plastic tape so as to provide magnetic permeability properties thereto;

whereby said wound layers of flexible plastic tape form an inductance due to the magnetic permeability properties thereof when an alternating current signal is imposed on said conductive material layer between said electrical connections, and wherein the reactive value of said inductance appears between said electrical connections at the ends of said wound conductive material layer; and wherein the length and thickness of said flexible plastic tape are each chosen so that the reactive value of said inductance has a selected value.

2. The wound, solid state inductor of claim 1, wherein said material having magnetic or ferromagnetic properties is chosen from the group consisting of ferrous oxide, ferric oxide, and alloys of iron, nickel, zinc, magnesium, manganese, cobalt, and combinations thereof;

wherein said plastic base material is chosen from the group consisting of mylar, vinyl, PET, PVC, polyethylene, PTFE, and combinations and mixtures thereof; and wherein said at least one layer of electrically conductive material is chosen from the group of metals consisting of aluminum, gold, silver, copper, and mixtures and alloys thereof.

3. The wound, solid state inductor of claim 1, having two layers of electrically conductive material placed one on each of said two surfaces of said tape.

4. The wound, solid state inductor of claim 3, further comprising a further electrically insulating layer placed over at least one of said electrically conductive material layers, so as to provide electrical insulation between said two electrically conductive material layers when said tape is wound.

5. The wound, solid state inductor of claim 4, wherein said further insulating layer is a further layer of flexible plastic tape having electrically insulative and magnetic permeability properties.

6. The wound, solid state inductor of claim 5, wherein an isolation transformer is constituted between said flexible plastic tapes, having primary and secondary windings formed by said two layers of electrically conductive material.

7. The wound, solid state inductor of claim 3, wherein a capacitance is formed between said two layers of electrically conductive material when a voltage is imposed between said layers.

8. The wound, solid state inductor of claim 7, wherein the length and thickness of said flexible plastic tape are each chosen so that the reactive value of each of said inductance and said capacitance has a selected value.

9. The wound, solid state inductor of claim 1, wherein said wound inductor is formed by spirally winding said tape.

10. The wound, solid state inductor of claim 1, wherein said wound inductor is formed by helically winding said tape about an insulating mandrel.

11. The wound, solid state inductor of claim 10, wherein said mandrel is removed from said wound inductor after it has been wound.

12. A wound, solid state inductor comprising a plurality of wound layers of a flexible plastic tape having electrically insulative and magnetic permeability properties, where said tape has two surfaces, a finite length, and a selected thickness, and has two layers of electrically conductive material placed one on each of said two surfaces of said tape;

wherein each of said two layers of electrically conductive material has a finite length which is the same as the finite length of said tape;

wherein electrical connections are made to each of said electrically conductive material layers at each end thereof;

wherein a fine powdered or particulate material having magnetic or ferromagnetic properties is embedded into a plastic base material for said flexible plastic tape so as to provide magnetic permeability properties thereto; and wherein each of said two layers of electrically conductive material is offset laterally across the width of said tape with respect to the other of said two layers so that, when said tape is wound such that said two surfaces of said tape face each others, said two layers do not contact each other.

13. The wound, solid state inductor of claim 12, wherein said material having magnetic or ferromagnetic properties is chosen from the group consisting of ferrous oxide, ferric oxide, and alloys of iron, nickel, zinc, magnesium, manganese, cobalt, and combinations thereof;

wherein said plastic base material is chosen from the group consisting of mylar, vinyl, PET, PVC, polyethylene, PTFE, and combinations and mixtures thereof; and wherein said at least one layer of electrically conductive material is chosen from the group of metals consisting of aluminum, gold, silver, copper, and mixtures and alloys thereof.

14. The wound, solid state inductor of claim 12, wherein said wound inductor is formed by spirally winding said tape.

15. The wound, solid state inductor of claim 12, wherein said wound inductor is formed by helically winding said tape about an insulating mandrel.

16. The wound, solid state inductor of claim 15, wherein said mandrel is removed from said wound inductor after it has been wound.

17. The wound, solid state inductor of claim 12, wherein the length and thickness of said flexible plastic tape are each chosen so that the reactive value of said inductance has a selected value.

18. The wound, solid state inductor of claim 12, wherein a capacitance is formed between said two layers of electrically conductive material when a voltage is imposed between said layers.

19. The wound, solid state inductor of claim 18, wherein the length and thickness of said flexible plastic tape are each chosen so that the reactive value of each of said inductance and said capacitance has a selected value.

20. The wound, solid state inductor of claim 12, wherein an isolation transformer is formed having primary and secondary windings, where said winding comprise said two layers of electrically conductive material.

* * * * *